(12) United States Patent
Sauciuc

(10) Patent No.: US 9,612,060 B2
(45) Date of Patent: Apr. 4, 2017

(54) DIRECT AIR IMPINGEMENT COOLING OF PACKAGE STRUCTURES

(75) Inventor: Ioan Sauciuc, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 835 days.

(21) Appl. No.: 13/992,422

(22) PCT Filed: Dec. 30, 2011

(86) PCT No.: PCT/US2011/068203
§ 371 (c)(1),
(2), (4) Date: Jun. 7, 2013

(87) PCT Pub. No.: WO2013/101212
PCT Pub. Date: Jul. 4, 2013

(65) Prior Publication Data
US 2013/0248153 A1    Sep. 26, 2013

(51) Int. Cl.
*F28D 15/04* (2006.01)
*F28F 13/06* (2006.01)
(Continued)

(52) U.S. Cl.
CPC ......... *F28D 15/04* (2013.01); *F28D 15/0275* (2013.01); *F28F 13/06* (2013.01); *F28F 23/00* (2013.01); *H01L 23/467* (2013.01); *H01L 23/4735* (2013.01); *F28F 2260/02* (2013.01); *H01L 2224/73204* (2013.01); *H01L 2224/73253* (2013.01); *H01L 2924/1461* (2013.01)

(58) Field of Classification Search
CPC ...... F28D 15/04; F28D 15/0275; F28F 13/06; F28F 23/00; F28F 2260/02; H01L 23/467; H01L 23/4735; H01L 23/427; H01L 2224/73204; H01L 2224/73253; H01L 2924/1461
See application file for complete search history.

(56) References Cited

U.S. PATENT DOCUMENTS 5,304,845 A * 4/1994 Lindquist ............. H01L 23/467
   165/80.3
5,310,440 A * 5/1994 Zingher ................. F28F 13/02
   156/345.11
(Continued)

FOREIGN PATENT DOCUMENTS

WO    2013/101212 A1    7/2013

OTHER PUBLICATIONS

International Search Report and Written Opinion received for PCT Application No. PCT/US2011/068203, Mailed on Sep. 28, 2012, 12 pages.
(Continued)

*Primary Examiner* — Tho V Duong
(74) *Attorney, Agent, or Firm* — Winkle, PLLC

(57) ABSTRACT

Various embodiments of microelectronic package cooling assemblies are described. Those embodiments include a cooling assembly comprising an array of vertically separated micro channels coupled to a heat spreader, wherein the heat spreader is finless, and wherein each inlet micro channel has two adjacent outlet micro channels. A distance between individual vertically separated micro channels comprises less than about 20 microns, and a heat pipe is embedded in the heat spreader.

13 Claims, 7 Drawing Sheets

(51) Int. Cl.
   *F28F 23/00* (2006.01)
   *F28D 15/02* (2006.01)
   *H01L 23/473* (2006.01)
   *H01L 23/467* (2006.01)

(56) References Cited

U.S. PATENT DOCUMENTS

| | | | |
|---|---|---|---|
| 5,705,854 A * | 1/1998 | Atarashi | H01L 23/4336 257/721 |
| 7,204,298 B2 | 4/2007 | Hodes et al. | |
| 7,233,494 B2 * | 6/2007 | Campbell | H01L 23/4735 165/80.4 |
| 7,343,963 B2 * | 3/2008 | Zoodsma | H05K 7/20781 165/104.33 |
| 7,443,677 B1 * | 10/2008 | Zhou | F28D 15/0275 165/104.21 |
| 7,742,299 B2 | 6/2010 | Sauciuc et al. | |
| 2004/0206477 A1 | 10/2004 | Kenny et al. | |
| 2005/0139992 A1 | 6/2005 | Holalkere et al. | |
| 2007/0000256 A1 | 1/2007 | Chau et al. | |

OTHER PUBLICATIONS

International Preliminary Report on Patentability and Written Opinion received for PCT Patent Application No. PCT/US2011/068203, mailed on Jul. 10, 2014, 7 pages.

* cited by examiner

DIRECT AIR IMPINGEMENT COOLING OF PACKAGE STRUCTURES

BACKGROUND OF THE INVENTION

Microelectronic devices are put under severe workloads during use that may affect performance. Challenges involved with such devices include cooling the devices as miniaturization continues to track Moore's Law.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

DETAILED DESCRIPTION OF THE PRESENT INVENTION

Figure 1:
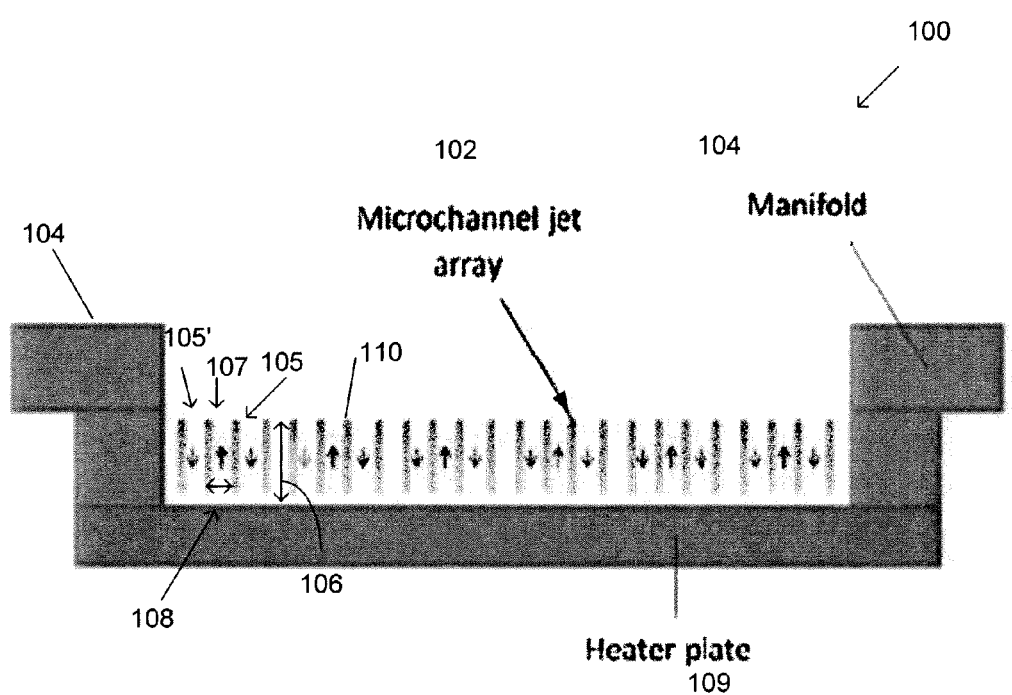
FIG. 1 represents a structure according to various embodiments.

In the following detailed description, reference is made to the accompanying drawings that show, by way of illustration, specific embodiments in which the methods may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals refer to the same or similar functionality throughout the several views.

Embodiments of microelectronic cooling assembly structures and methods of utilization such structures are described. Those assemblies and methods may include a cooling assembly comprising an array of vertically separated micro channels coupled to a heat spreader, wherein the heat spreader is finless, and wherein each inlet micro channel has two adjacent outlet micro channels. A distance between individual vertically separated micro channels comprises less than about 20 microns, and a heat pipe is embedded in the heat spreader. The embodiments herein enable direct air impingement cooling which in turn enables high cooling rate of die, as well as providing a low Z-height thermal solution for microelectronic die that may comprise a portion of a package structure, in some embodiments.

FIG. 1 shows the vertical cross section of an embodiment of a cooling solution, such as a direct air cooling solution 100. The cooling solution 100, which may comprise a portion of a cooling solution for a microelectronic die in an embodiment, may comprise inlet/outlet manifolds 104 that maybe coupled to a fluid source, a heater spreader 109, and a micro channel jet array 102. Fluid that may flow through the array of micro channel jets 102 may impinge on the hot surface of the spreader plate 109. In an embodiment, the manifolds 104 may provide passages for air inlet and outlet.

In an embodiment, a fluid, such as one of liquid and a compresses gas (i.e. air, helium, $CO_2$, etc.) that may be incoming from two in coming micro channel jets 105, 105', may impinge on the hot surface of the heat spreader plate 109, and then may pick up the heat from the heater spreader 109. The heat may then be circulated away away/transferred into an adjacent outgoing micro jet channel 107, wherein the heat may later exit into the ambient environment, via the manifolds 104, in some cases. The fluid that is in contact with the heater spreader 109, may travel only a few hundred microns before exiting into the ambient, since the dimensions of individual incoming micro channel jets 105, 105' and the outgoing micro channel jets 107 of the micro channel jet array 102 are on the order of microns in size, thus keeping the thermal boundary very small.

In an embodiment, individual micro channel jets 105, 105', 107 may comprise a height 106 of about 200 microns or less, and a width 108 of about 10 microns or less although the height 106 and the width 108 may vary according to the particular application. In another embodiment, the width 108 may comprise about 20 microns or less. In an embodiment, the number of micron sized micro channel jets in the array 102 may be numerous, and may comprise hundreds to thousands of channel jets and may be arranged in a vertical orientation across the heater plate 109. Individual micro jets may comprise a wall 110 that may serve to separate the micro jets of the array 120 from each other. In an embodiment, a distance between individual vertically separated micro channels of the array 102 may comprise about 20 to about 200 microns.

The multiple-jet impingement system of the cooling solution 100 removes the downside of boundary layer build up, thus enhancing the overall heat transfer of the system. In some embodiments, each inlet channel may have it's own adjacent outlet channel, however for other embodiments, every two incoming micro jets 105, 105' may have their own outlet micro jet 107 reducing the interaction between the micro channel jets and also providing for a nearly uniform heat transfer coefficient across the entire heater spreader surface 109.

Maintaining such a small thermal boundary in the cooling assembly 100 maximizes the heat transfer coefficient to limits never seen before in prior art conventional air cooling assemblies. The performance of such a direct fluid cooling solution 100 quickly approaches the spreading resistance fundamental limit. In an embodiment, the cooling solution 100 can achieve a high heat transfer coefficient by using compressed air, for example, and may achieve cooling rates as high as 200 degrees Celsius per second.

Figure 2A:
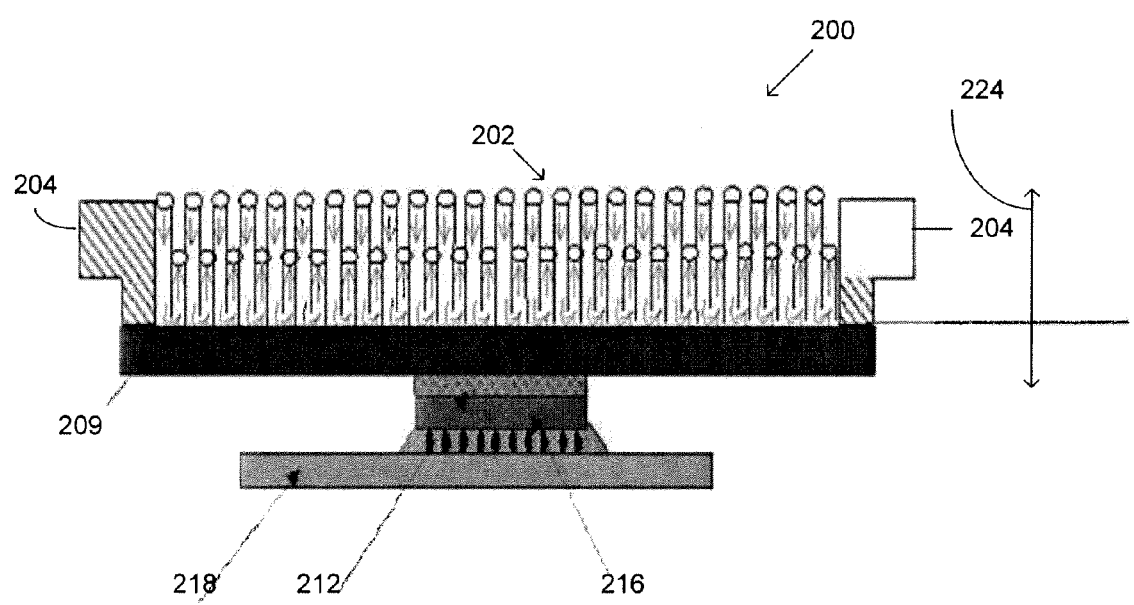
FIGS. 2a-2d represents structures according to various embodiments.

FIG. 2a illustrates an embodiment of a cooling assembly 200, such as a direct air cooling assembly 200 that may cool a portion of a microelectronic die 216, for example. The die 216 may comprise a thermal insulation material (TIM) 212 disposed on the die 216, wherein the die 216 may be disposed on a substrate 218. A heater plate 209 may be thermally coupled with the die 216, and may be disposed on the TIM 212. The die 216 may comprise any type of microelectronic die, such as but not limited to central processing unit (CPU) die that may comprise a portion of a multi-chip, 3-D package, for example. An array of vertical micro channels 202 maybe coupled with the heat spreader plate 209. The array of vertical micro channels 202 may comprise either single inlet/outlet pairs or two inlet into associated with one outlet jet, similar to inlet/outlet jets of FIG. 1d, for example, in some cases.

Since the spreading plate 209 is in thermal contact with the array of vertical micro channels (which may comprise injection molded vertical channels) 202, heat generated by the die 216 may be transferred from the die 216 to the spreading plate 209 and subsequently to the air circulated into the vertical micro channel array 202. The cooling solution 200 of FIG. 2a may comprise a small Z-height 224, which may comprise about 2 mm or below in some cases. Manifolds 204 may further serve to attach the array of micro channels 202 to the spreading plate 209.

Any microelectronic device/system may benefit from utilizing the cooling solution 200, especially for low z-height applications, such as for blade servers used in data centers. The embodiments significantly reduce the Z-height over prior art thermal cooling solutions (especially those used in server data centers), and improve air cooling performance significantly beyond the limits for prior art heat sink volumetric solutions.

Figure 2B:
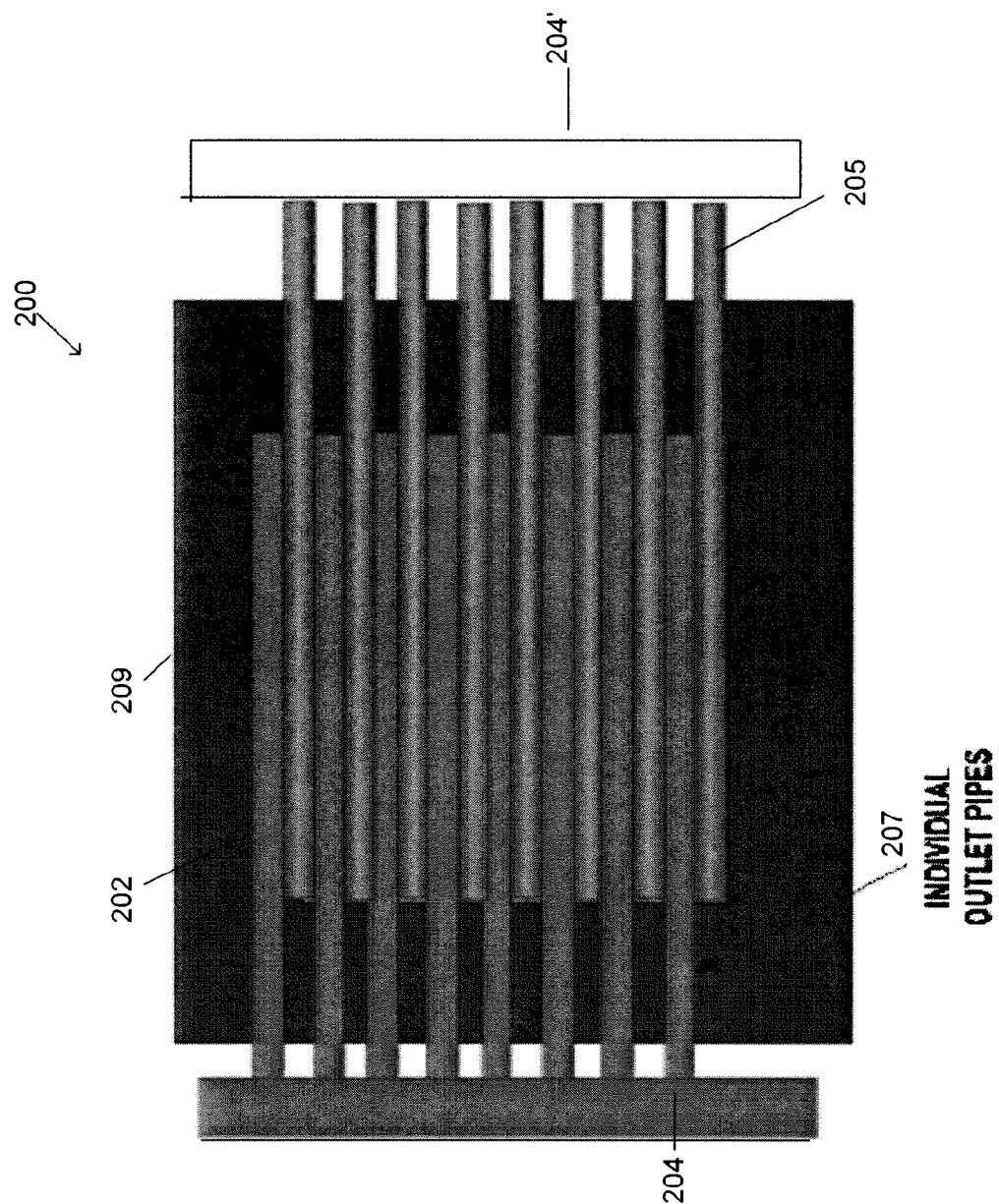
Figure 2C:
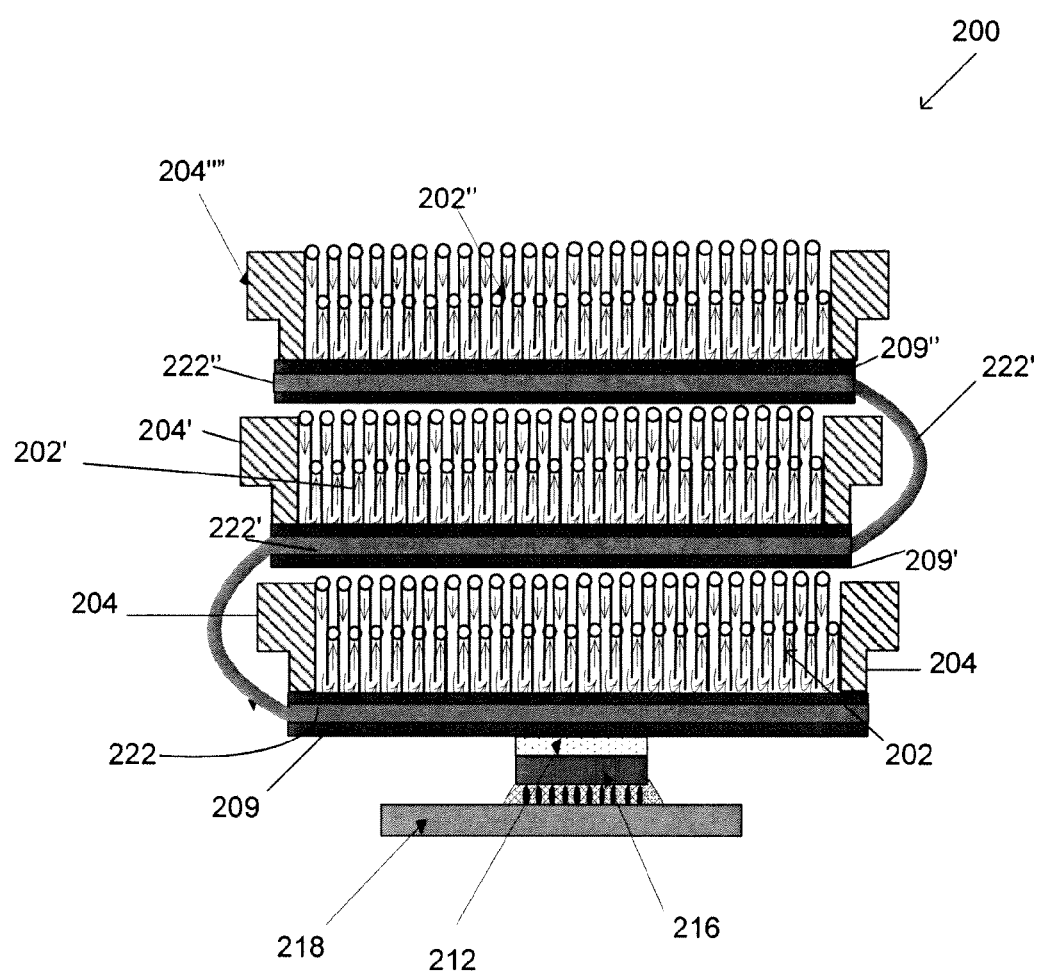

FIG. 2b depicts a top view of an embodiment of the cooling solution 200. Inlet pipes 205 and outlet pipes 207 of the micro channel array 202 are coupled with the spreader plate 209. A separate manifold 204, 204' may couple with the inlet pipes and outlet pipes 205, 207 respectively. FIG. 2c depicts a cooling solution wherein a number of heating plates 209 may be used. A first array of vertical micro channels 202, are disposed on a first heat spreader 209, which is thermally coupled with a die 216. A TIM 212 is disposed on the die 216, wherein the die 216 is disposed on a package substrate 218.

In an embodiment, a first heat pipe portion 222 may be embedded within the first heat plate 209. The first heat pipe portion 222 may comprise a portion embedded in the first heat plate 209, and a portion that is bent around an exterior portion of a first pair of manifolds 204, wherein one of the first pair of manifolds 204 may be adjacent to either side of a first array of vertical micro channels 202. In an embodiment, the bent portion of the first heat pipe portion 222 may be disposed adjacent to only one of the manifolds 204 of the cooling assembly 200.

The first array of vertical micro channels 202 maybe coupled with the first spreader plate 209. The first array of vertical micro channels 202 may comprise either pairs of single inlet/outlet or two inlet jets associated with one outlet jet (similar to the two inlet jets 105, 105', 107 of FIG. 1, for example). In an embodiment, heat absorbed from the die 216 by the first spreader plate 209 may then be directed into the first heat pipe portion 222. The first heat pipe portion 222 may bend around the outside of the cooler assembly 200 and then a second heat pipe portion 222' may be disposed within a second heat spreader 209'. The second heat spreader 209' may be coupled to a second array of vertical micro channels 202'. The second array of vertical micro channels 202' may be disposed on top of the second heat spreader 209'. The second heat spreader 209' may be disposed on/above the first array of vertical micro channels 202.

A portion of the second heat pipe portion 222' may be embedded within the second heat spreader 209'. A bent portion of the second heat pipe portion 222' may be bent around the outside of the cooler assembly 200 adjacent one of a pair of manifolds 204' that may be coupled with the second heat spreader 209'. A third heat pipe portion 222" may then be embedded within a third heat spreader 209". The third heat spreader 209" may be disposed on/above the second array of vertical micro channels 202'. The third heat pipe portion 222' may be couple to/beneath a third array of vertical micro channels 202". A pair of manifolds 104" may be adjacent the third array of vertical micro channels 202".

In an embodiment, each of the heat spreading plates 209, 209', 209" is in thermal contact with the plurality of injection molded vertical channels 202, 202', 202". In an embodiment, the heat may be transferred from the die 216, such as a CPU die 216, to the heat spreading plates 209, 209', 209" and may then be subsequently transferred to the air circulated into the vertical micro channels arrays 202, 202', 202".

Figure 2D:
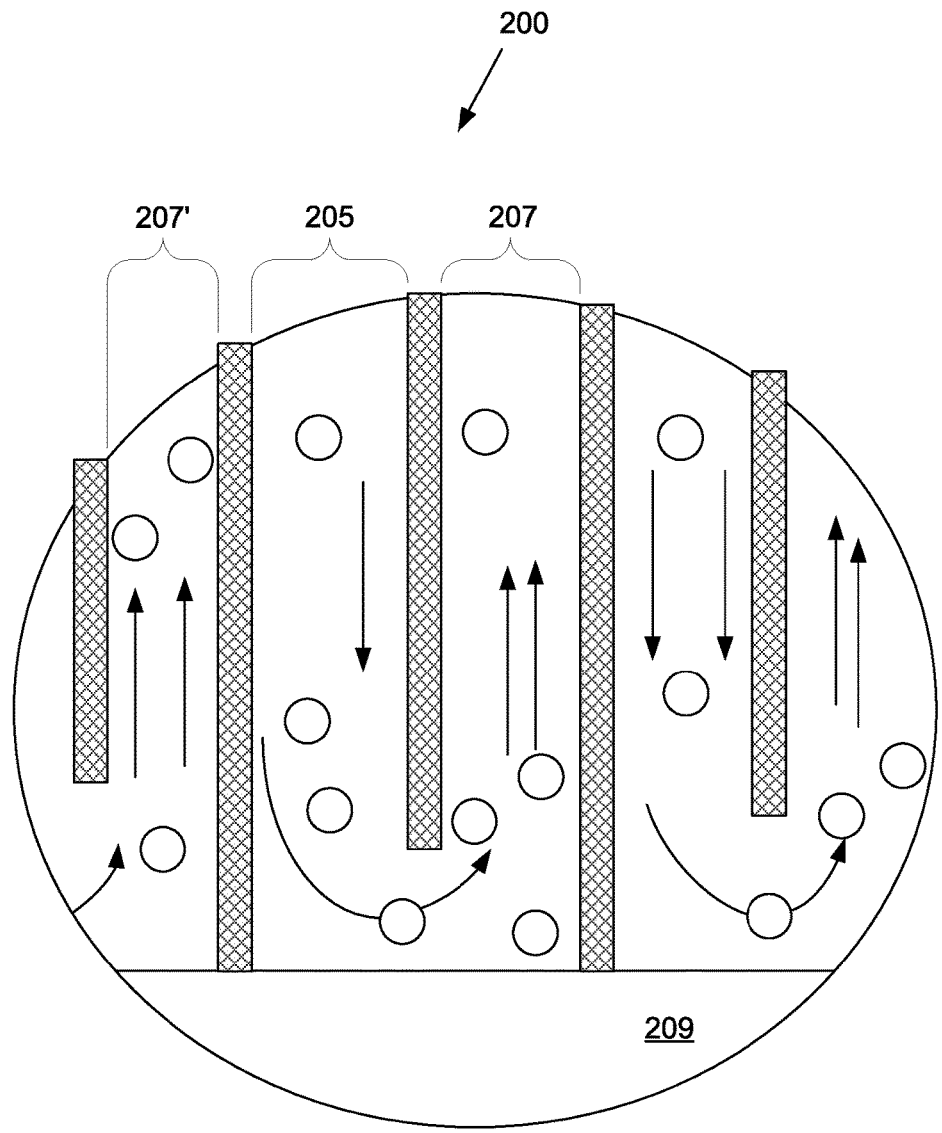

FIG. 2d depicts a cross sectional portion of the cooling system 200 wherein the array of vertically separated micro channels 202 are attached to the heat spreader 209. In an embodiment, each inlet channel 205 has two outlet channels 207, 207' associated with it. When air circulates through the vertical micro channel array 202, it makes contact with the spreader plate 209. The air travels only tens of microns (since a distance between individual micro channels may comprise less than about 20 microns in some cases) and then exits into the ambient. In this way, the heat transfer coefficient may be maximized and thus the fluid preheating effect may be avoided. The performance of the cooling solution 200 quickly approaches the spreading resistance fundamental limit.

In an embodiment, the heat plate 209 comprises a finless structure. In an embodiment, compressed air may be circulating through the micro channels (for example, the compressed air may be provided by the building facility). The Z-height of the cooling solution 200 may comprise less than about 2 mm, in some embodiments. The heat spreading area of the cooling solution 100 may be maximized within the current existing volumetric by the use of the bent heat pipes and multiple heat plates, with such vertical channels attached to them. In some cases, liquid cooling performance may be achieved within current volumetric. Prior art parallel plate heat sinks may typically use liquid cooling solutions which require very large sized heat exchangers. For example, a conventional heat sink may comprise a 13 mm height. In an embodiment, virtually the same cooling performance can be achieved using a z-height for the cooling solution of about 4 mm or less.

Benefits of using vertical individual inlet/outlet channels attached to a heat spreader plates with bent heat pipes and multiple heat spreader plates serve to increase the current spreading area multiple times within current volumetric. All heat spreading areas (i.e. all multiple spreading plates) are exposed to such individual air cooled channels. Quick connection may be enabled to compressed air (i.e. building facility). Also, the cooling solution 200 may or may not utilize heat plates comprising microfin structures for heat dissipation. In an embodiment, micro channels comprising about 3 mm in height can match the performance of cooling solutions comprising 11 mm tall fins, thus achieving a reduction of greater than about 300% in z-height for the cooling solution of the embodiments herein.

Figure 3:
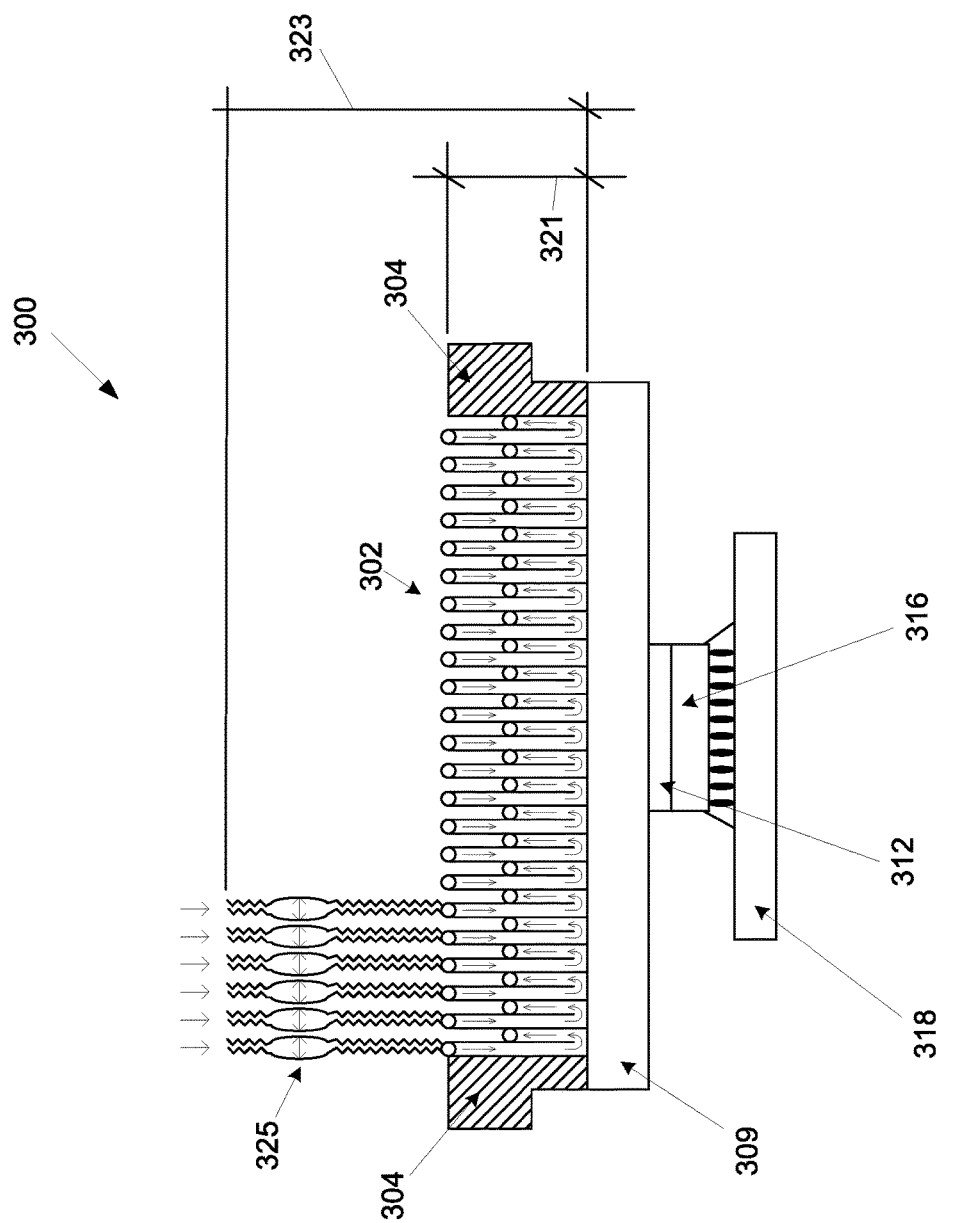
FIG. 3 represents a structure according to various embodiments.
Figure 4:
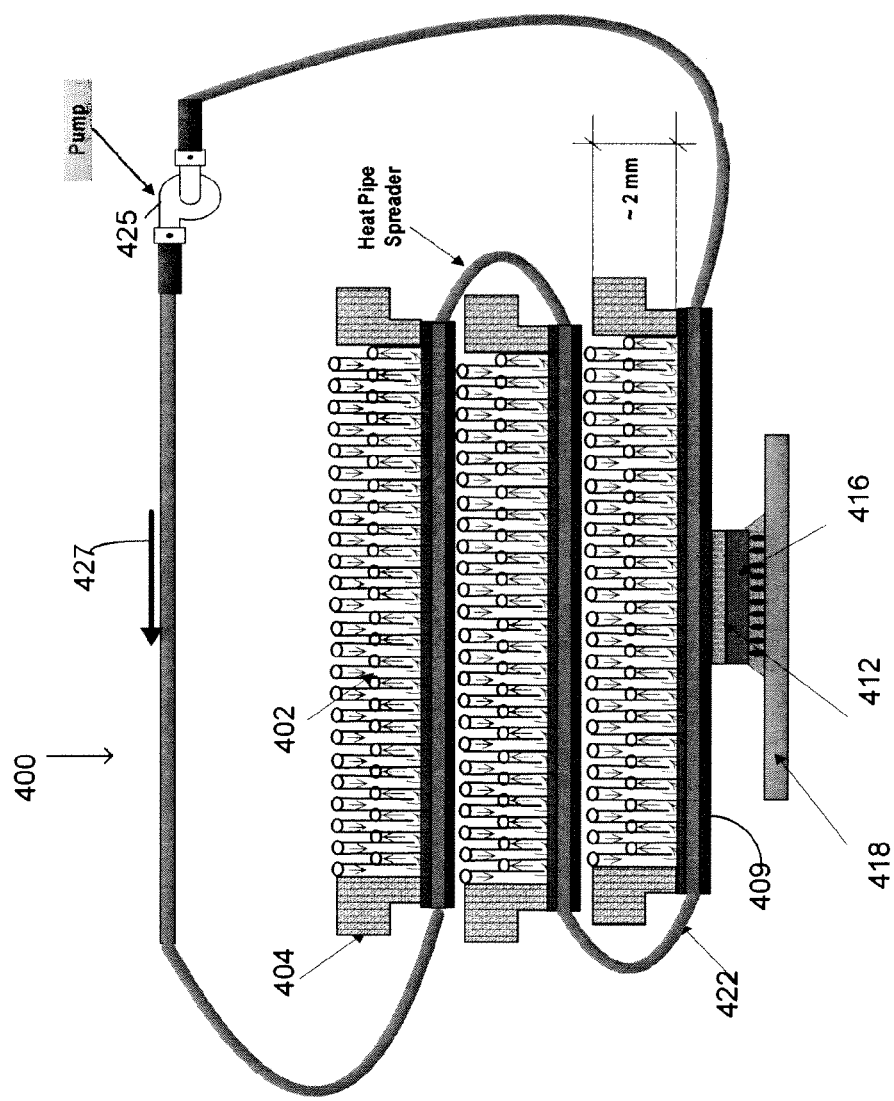
FIG. 4 represents a structure according to various embodiments.

FIG. 3 depicts an embodiment wherein at least one pump/blower 325 may be coupled to an array of vertical micro channels 302 disposed within a cooling solution 300. In an embodiment, the pump/blower 325 may comprise at least one of a piezo electric blower and a micro electromechanical system (MEMS) pump. In an embodiment, each inlet/outlet of the vertical array of micro channels 302 may comprise their own individual the pump/blower 325. In some cases the cooling system 300 may be utilized in mobile device applications, such as in smart phones, laptop computers etc. In some embodiments each inlet outlet of the array 302 may comprise its own pump/blower 325 or a series of the pump/blowers may be connected to one air pump (not shown). In an embodiment, a z-height 321 for the cooling system 300 may comprise about 2 mm or less, and a total height 323 including the pump/blower 325 may comprise about 5 mm or less. FIG. 4 depicts an embodiment of a cooling solution 400 wherein a liquid/fluid coolant 427 may be utilized, wherein the fluid 427 may be pumped through pipes 422 by a pump 425 to cool a die 416. The cooling solution 400 may comprise multiple pipes with bent portions 409, multiple micro channel arrays 402, multiple manifolds 404, as well as a TIM 412 and substrate 418, similar to those depicted in FIG. 2, for example.

Benefits of the cooling solution embodiments include minimizing the cooling air travel path to tens of microns or less (compared to tens of millimeters in typical prior art cooling solutions). The need for heat sink fins is eliminated, so that the fin volume can be used to increase spreading area and allow for allocation of the 2 mm tall micro channels. Installation of vertical individual inlet/outlet micro channels coupled a heat spreader plate (i.e. by injection molding) is enabled. Bent heat pipes increase the current spreading area multiple times within current volumetric. All spreading areas are exposed to such individual air cooled channels. Compressed air (i.e. from the building facility) may be used as a fluid, and can obtain liquid cooling performance. In some cases compressed air from the facility may be replaced with micro blowers/pumps.

Although the foregoing description has specified certain steps and materials that may be used in the assemblies of the embodiments herein, those skilled in the art will appreciate that many modifications and substitutions may be made. Accordingly, it is intended that all such modifications, alterations, substitutions and additions be considered to fall within the spirit and scope of the invention as defined by the appended claims. In addition, the Figures provided herein may illustrate only portions of an exemplary microelectronic devices that pertain to the practice of the various embodiments. Thus the embodiments are not limited to the structures/assemblies described herein.

What is claimed is:

1. A cooling assembly comprising:
   a first array of vertically separated micro channels coupled to a first heat spreader, wherein the first heat spreader is finless, and wherein the first array of vertically separated micro channels includes a plurality of inlet micro channels and a plurality of outlet micro channels, and which each outlet micro channel has two adjacent inlet micro channels, such that there are twice as many inlet micro channels as outlet micro channels within the first array of vertically separated micro channels;
   a first heat pipe embedded in the first heat spreader, wherein the first heat pipe has a liquid/fluid coolant disposed therein;
   a second heat spreader disposed above the first heat spreader; and
   a fluid source coupled to the first array of vertically separated micro channels, wherein the liquid/fluid coolant of the first heat pipe is separate from the fluid source of the first array of vertically separated micro channels.

2. The cooling assembly of claim 1 wherein the fluid comprises one of a liquid and a compressed gas.

3. The cooling assembly of claim 1 wherein the micro channels comprise a height of less than about 2 mm.

4. The cooling assembly of claim 1 further comprising a second heat pipe embedded in the second heat spreader, wherein a portion of the first heat pipe and a portion of the second heat pipe are bent.

5. The cooling assembly of claim 1 further comprising a third heat spreader disposed above the second heat spreader.

6. The cooling assembly of claim 1 wherein a distance between individual vertically separated micro channels comprises between about 20 to about 200 microns.

7. The cooling assembly of claim 1 further comprising a die coupled to the cooling assembly.

8. The cooling assembly of claim 7 further comprising a TIM coupled to the die, wherein the die is coupled with a package structure.

9. The cooling assembly of claim 1 further comprising a second heat pipe embedded in the second heat spreader, wherein the first heat pipe and the second heat pipe are in fluid communication with one another.

10. The cooling assembly of claim 1 further comprising a second heat pipe embedded in the second heat spreader and a third heat spreader disposed above the second heat spreader.

11. The cooling assembly of claim 10 further comprising a third heat pipe embedded in the third heat spreader.

12. The cooling assembly of claim 11 wherein the third heat pipe and the second heat pipe are in fluid communication with one another.

13. The cooling assembly of claim 12 wherein the third heat pipe and the second heat pipe are in fluid communication with the first heat pipe.

* * * * *